United States Patent
Chong et al.

(10) Patent No.: US 8,671,303 B2
(45) Date of Patent: *Mar. 11, 2014

(54) WRITE-LEVELING IMPLEMENTATION IN PROGRAMMABLE LOGIC DEVICES

(75) Inventors: Yan Chong, San Jose, CA (US); Bonnie I. Wang, Cupertino, CA (US); Chiakang Sung, Milpitas, CA (US); Joseph Huang, Morgan Hill, CA (US); Michael H. M. Chu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/349,228

(22) Filed: Jan. 12, 2012

(65) Prior Publication Data

US 2012/0106264 A1 May 3, 2012

Related U.S. Application Data

(63) Continuation of application No. 11/843,123, filed on Aug. 22, 2007, now Pat. No. 8,122,275.

(60) Provisional application No. 60/840,107, filed on Aug. 24, 2006.

(51) Int. Cl.
*G11C 8/00* (2006.01)

(52) U.S. Cl.
USPC ...... 713/401; 713/400; 713/375; 365/233.06; 365/233.1; 365/233.17; 365/236

(58) Field of Classification Search
USPC .......... 713/400–401, 375; 365/233.06, 233.1, 365/233.71, 236
See application file for complete search history.

(56) References Cited

U.S. PATENT DOCUMENTS

| 3,831,195 A | 8/1974 | Davis et al. |
| 4,502,143 A | 2/1985 | Kato et al. |

(Continued)

FOREIGN PATENT DOCUMENTS

| EP | 1 113 616 | 7/2001 |
| GB | 1 468 465 | 3/1977 |

(Continued)

OTHER PUBLICATIONS

European Search Report, Application No. EP 06 25 0066, dated Jun. 16, 2006.

(Continued)

*Primary Examiner* — M Elamin
(74) *Attorney, Agent, or Firm* — Ropes & Gray LLP

(57) ABSTRACT

Circuits, methods, and apparatus for memory interfaces that compensate for skew between a clock signal and DQ/DQS signals that may be caused by a fly-by routing topology. The skew is compensated by clocking the DQ/DQS signals with a phase delayed clock signal, where the phase delay has been calibrated. In one example calibration routine, a clock signal is provided to a receiving device. A DQ/DQS signal is also provided and the timing of their reception compared. A delay of the DQ/DQS signal is changed incrementally until the DQ/DQS signal is aligned with the clock signal at the receiving device. This delay is then used during device operation to delay a signal that clocks registers providing the DQ/DQS signals. Each DQ/DQS group can be aligned to the clock, or the DQS and DQ signals in a group may be independently aligned to the clock at the receiving device.

20 Claims, 12 Drawing Sheets

(56) References Cited

U.S. PATENT DOCUMENTS

| | | | |
|---|---|---|---|
| 4,584,695 A | 4/1986 | Wong et al. | |
| 5,059,924 A | 10/1991 | JenningsCheck | |
| 5,355,090 A | 10/1994 | Pajowski et al. | |
| 5,668,830 A | 9/1997 | Georgiou et al. | |
| 5,714,904 A | 2/1998 | Jeong | |
| 5,986,990 A | 11/1999 | Moon | |
| 6,100,735 A | 8/2000 | Lu | |
| 6,125,157 A | 9/2000 | Donnelly et al. | |
| 6,259,755 B1 | 7/2001 | O'Sullivan et al. | |
| 6,266,799 B1 | 7/2001 | Lee et al. | |
| 6,282,204 B1 | 8/2001 | Balatoni et al. | |
| 6,292,116 B1 | 9/2001 | Wang et al. | |
| 6,359,815 B1 | 3/2002 | Sato et al. | |
| 6,396,788 B1 | 5/2002 | Feyh et al. | |
| 6,452,591 B1 | 9/2002 | Ho et al. | |
| 6,525,615 B1 | 2/2003 | Masenas et al. | |
| 6,650,140 B2 | 11/2003 | Lee et al. | |
| 6,693,985 B2 | 2/2004 | Li et al. | |
| 6,750,675 B2 | 6/2004 | Venkata et al. | |
| 6,807,225 B1 | 10/2004 | Tonietto et al. | |
| 6,854,044 B1 | 2/2005 | Venkata et al. | |
| 6,900,676 B1 | 5/2005 | Tamura | |
| 6,934,301 B2 | 8/2005 | Jordan | |
| 7,089,444 B1 | 8/2006 | Asaduzzaman et al. | |
| 7,091,890 B1 | 8/2006 | Sasaki et al. | |
| 7,138,837 B2 | 11/2006 | Venkata et al. | |
| 7,180,972 B1 | 2/2007 | Venkata et al. | |
| 7,190,754 B1 | 3/2007 | Chang et al. | |
| 7,242,221 B1 | 7/2007 | Hoang et al. | |
| 7,305,058 B1 | 12/2007 | Venkata et al. | |
| 7,349,509 B2 | 3/2008 | Ribo et al. | |
| 7,366,267 B1 | 4/2008 | Lee et al. | |
| 7,397,788 B2 | 7/2008 | Mies et al. | |
| 7,543,209 B2 | 6/2009 | Bonneau et al. | |
| 7,680,232 B2 | 3/2010 | Shumarayev et al. | |
| 8,122,275 B2 * | 2/2012 | Chong et al. | 713/401 |
| 2001/0033188 A1 | 10/2001 | Aung et al. | |
| 2002/0049917 A1 | 4/2002 | Portman et al. | |
| 2002/0141515 A1 | 10/2002 | Enam et al. | |
| 2002/0186804 A1 | 12/2002 | Dorschky et al. | |
| 2002/0190751 A1 | 12/2002 | Lee et al. | |
| 2003/0006808 A1 | 1/2003 | Weng et al. | |
| 2003/0012322 A1 | 1/2003 | Partsch et al. | |
| 2003/0052709 A1 | 3/2003 | Venkata et al. | |
| 2003/0086517 A1 | 5/2003 | Vallet et al. | |
| 2003/0210758 A1 | 11/2003 | Lee et al. | |
| 2003/0212930 A1 | 11/2003 | Aung et al. | |
| 2003/0217214 A1 | 11/2003 | Calvignac et al. | |
| 2003/0218486 A1 | 11/2003 | Kwak | |
| 2004/0085974 A1 | 5/2004 | Mies et al. | |
| 2004/0095863 A1 | 5/2004 | Verboom et al. | |
| 2004/0114632 A1 | 6/2004 | Yuuki et al. | |
| 2004/0140837 A1 | 7/2004 | Venkata et al. | |
| 2004/0141567 A1 | 7/2004 | Yang et al. | |
| 2004/0247045 A1 | 12/2004 | Marbot et al. | |
| 2004/0252804 A1 | 12/2004 | Aoyama | |
| 2005/0036579 A1 | 2/2005 | Shiraishi | |
| 2005/0180536 A1 | 8/2005 | Payne et al. | |
| 2006/0029176 A1 | 2/2006 | Ge et al. | |
| 2006/0165204 A1 | 7/2006 | Shumarayev et al. | |

FOREIGN PATENT DOCUMENTS

| | | |
|---|---|---|
| JP | 05-313783 | 11/1993 |
| JP | 11-275066 | 10/1999 |
| JP | 2003-99321 | 4/2003 |
| JP | 2005-50228 | 2/2005 |
| JP | 2005-094597 | 4/2005 |
| WO | WO 2007/015915 | 2/2007 |

OTHER PUBLICATIONS

European Search Report, Application No. EP 09 15 7226, dated May 14, 2009.

Savoj, B. and Razavi, J., Clock and Data Recovery Architectures, High-Speed CMOS Circuits for Optical Receivers, 2001, pp. 21-93.

* cited by examiner

WRITE-LEVELING IMPLEMENTATION IN PROGRAMMABLE LOGIC DEVICES

CROSS-REFERENCES TO RELATED APPLICATIONS

This application is a continuation of commonly assigned U.S. patent application Ser. No. 11,843,123 filed Aug. 22, 2007, now U.S. Pat. No. 8,122,275 which claims the benefit of U.S. provisional application No. 60/840,107, titled "WRITE-LEVELING IMPLEMENTATION IN PROGRAMMABLE LOGIC DEVICES," by Chong et al., filed Aug. 24, 2006, which are each incorporated by reference herein in its entirety.

BACKGROUND

The invention relates generally to memory interface circuits and more specifically to high speed multiple data-rate memory interface circuits.

Multiple data-rate interfaces, such as double data-rate interfaces, have become increasingly common. One such interface, the double data-rate (DDR) interface, communicates two bits of data per clock cycle at each data line. DDR interfaces are often used with high-speed memory devices, as well as other types of devices.

As DDR interfaces increase in speed, timing margins become smaller and more susceptible to error. For example, the accuracy in the timing between a clock signal and a data strobe signal (DQS) provided by a memory interface to a device such as a memory can be particularly important.

Typical DDR signals include DQS and data signals (DQ) provided by a transmitting device and received by a receiver, such as a memory. The receiver uses the DQS signals to retime and recover the DQ signals. For example, during write operations to a memory, the DQS signals may be center-aligned with the DQ data signals. In such a circuit, the receiving device samples and latches data from one or more DQ data signals on rising and falling edges of a DQS signal. Once in the memory device, the received data is then retimed from the DQS signal to an internal clock signal. The internal clock signal may be generated by a delay-locked loop that receives a clock signal from the transmitting device. Accordingly, for this internal retiming to properly occur, the timing between a DQS signal and a clock signal provided by a transmitting device should be well controlled.

In some DDR topologies, the clock signal provided by the transmitting device is provided to a number of memory devices in series, that is, to a first memory device, then a second, then a third, and so on. This topology is referred to as a "fly-by" topology and may also be used for control and address signals. This creates a skew, referred to as tDQSS, between the arrival time of a DQS signal and the clock signal at a memory device. Typically, this skew needs to remain below one-fourth of a clock cycle to avoid data reception problems in the memory device.

It is therefore desirable for a device and a memory interface to efficiently compensate for skew between clock and DQS signals provided to a memory device. It is also desirable to be able to compensate for a wide range of skew. It is further desirable for the device to be adaptable to the timing requirements of different interface standards with a high level of precision.

SUMMARY

An embodiment of the invention includes a memory write interface for outputting data from a device to one or more receiving memory devices. To compensate for skew between a clock and DQS signals, an embodiment of the present invention provides a programmable delay unit or tapped delay line that provides multiple phases of an input clock signal. The multiple phases of the clock signal are distributed to multiple output circuits, such as multiple DQ/DQS groups. Each DQ/DQS group includes multiplexers or other circuits for selecting among the multiple phases of the clock signal. This enables the DQ/DQS groups to provide signals having different relative phases to compensate for different skews at the receiving devices. The delay can be calibrated during a calibration routine where each of the phases of the clock signal are individually selected and used in determining the phase that results in the minimum skew.

In an exemplary embodiment of the present invention, an input clock signal is generated using a phase-locked loop. The input clock signal is sequentially delayed using a tapped delay line to generate a number of clock signals, each having a different phase. These clock signals are distributed to several DQ/DQS groups. Each DQ/DQS group includes a first multiplexer for selecting a first clock having a first phase to clock one or more DQS output registers and a second multiplexer for selecting a second clock having a second phase to clock one or more DQ output registers. To ensure data recovery at the receiver, the second clock phase is typically separated by approximately 90 degrees from the first clock phase.

In another exemplary embodiment of the present invention, two input clock signals are generated using a phase-locked loop. These two input clocks are separated in phase by 90 degrees. Each input clock signal is sequentially delayed using a tapped delay line to generate a first and a second set of clock signals, each clock signal in each set having a different phase. These two sets of clock signals are distributed to several DQ/DQS groups. Each DQ/DQS group includes a first multiplexer for selecting a first clock having a first phase from the first set to clock one or more DQS output registers and a second multiplexer for selecting a second clock having a second phase from the second set to clock one or more DQ output registers.

The clock signal used to clock a DQS signal may be determined during a calibration routine, where each of the clock phases is selected and used to generate a DQS signal, where the arrival of the DQS signal and a clock signal are compared at a receiving circuit for each clock phase. The clock having a phase that is 90 degrees separated from the clock calibrated for the DQS signal may be selected as the clock for the DQ signals. Alternately, the clock used to clock the DQ signals may be independently calibrated in a similar manner as above.

In an embodiment of the present invention, the tapped delay line can output a number of phases of the input clock signal. The difference between phases can be set to be less than or equal to a maximum skew tolerance for output signals. This ensures that output circuits can adjust their relative phases to be less than the maximum skew tolerance.

Various embodiments of the present invention may incorporate one or more of these or the other elements discussed herein. A better understanding of the nature and advantages of the present invention may be gained with reference to the following detailed description and the accompanying drawings.

DESCRIPTION OF EXEMPLARY EMBODIMENTS

Figure 1:
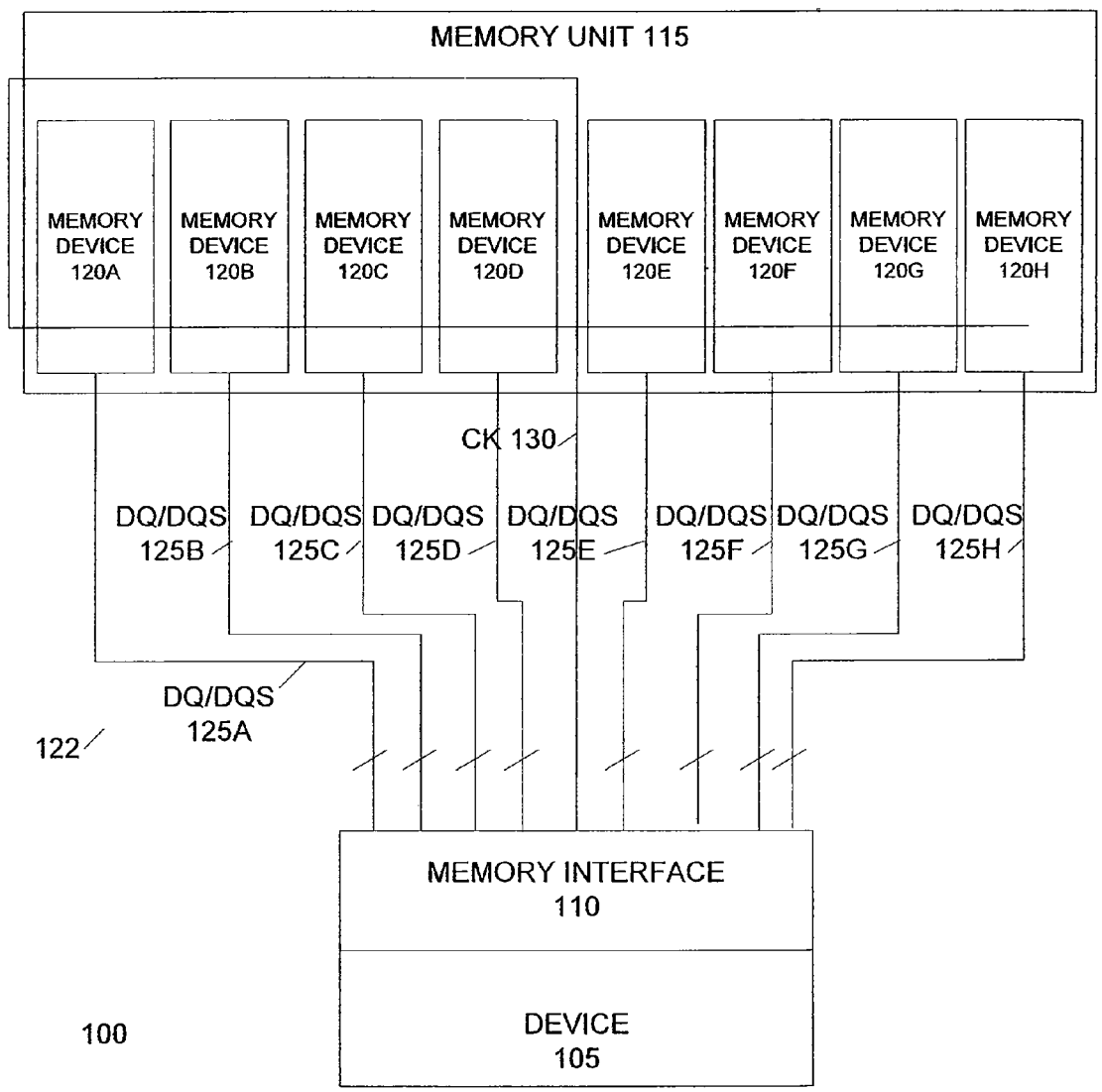
FIG. 1 illustrates an exemplary system configuration including a device and memory interface according to an embodiment of the invention.

FIG. 1 illustrates an exemplary system configuration 100 including a device 105 having a memory interface 110 according to an embodiment of the invention. System configuration 100 also includes a memory unit 115 made up of a number of devices 120. In an embodiment of the present invention, device 105 includes the memory interface 110 for facilitating communications between device 105, optionally other devices not shown in FIG. 1, and memory unit 115.

System 100 includes a communications bus 122 connecting memory interface 110 with memory unit 115. In an embodiment of the present invention, communications bus 122 includes sets or groups of DQ/DQS data signal connections 125. Each of the sets 125, such as sets 125*a*, 125*b*, 125*c*, 125*d*, 125*e*, 125*f*, 125*g*, and 125*h*, includes one or more DQ data signal connections for carrying data from the memory interface 110 to the memory unit 115 and a corresponding DQS signal connection for synchronizing data communications within the set of DQ/DQS data signal connections. For example, a common implementation of the DDR3-3 memory interface standard includes sets of DQ/DQS data signal connections 125 that each have eight DQ data signal connections and one corresponding DQS signal connection.

An embodiment of memory unit 115 includes individual memory devices 120, such as memory devices 120*a*, 120*b*, 120*c*, 120*d*, 120*e*, 120*f*, 120*g*, and 120*h*. Examples of memory devices 120 include DDR-3 compliant memory chips in any type of semiconductor package configuration. Alternate embodiments of the invention are applicable to memory devices 120 complying with other data communications standards. Memory devices 120 can be physically and electrically connected by memory unit 115 to allow for convenient installation. Examples of memory unit 115 include DIMM, SIMM, and other modular memory unit configurations known in the art.

In the system 100, each of the sets of DQ/DQS data signal connections 125 is connected with one of the memory devices 120 in memory unit 115. For example, DQ/DQS data signal connections set 125*a* connects memory interface 110 with memory device 120*a*, DQ/DQS data signal connections set 125*b* connects memory interface 110 with memory device 120*b*, and so forth.

A clock signal provided by the memory interface 110 on line 130 is routed to each of the memory devices in series, beginning with memory device 120A and ending with memory device 120H. Other control and address signals (not shown) may be similarly routed. This routing of the clock signal on line 130 is referred to as a fly-by network topology. While embodiments of the present invention are particularly well-suited for use in fly-by topologies, embodiments of the present invention can be utilized with tree network topologies or other topologies known in the art.

The fly-by topology results in a high-quality clock signal at the memory devices 120. Unfortunately, the clock signal takes a finite amount of time to travel from memory device 120A to memory device 120H. If the DQS signals from memory interface 110 are aligned, there will be a resulting skew tDQSS between the clock signal and a DQS signal at some of the memory devices 120. A timing diagram of this is shown in the following figures.

Figure 2:
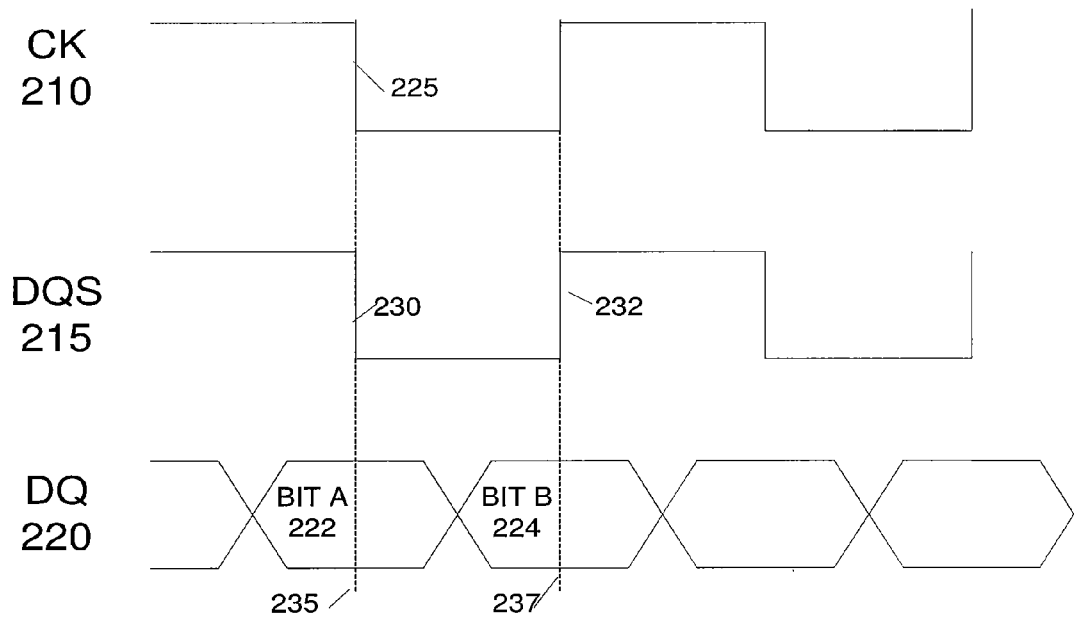
FIG. 2 is a timing diagram illustrating various types of skew in a communication interface.
Figure 2:
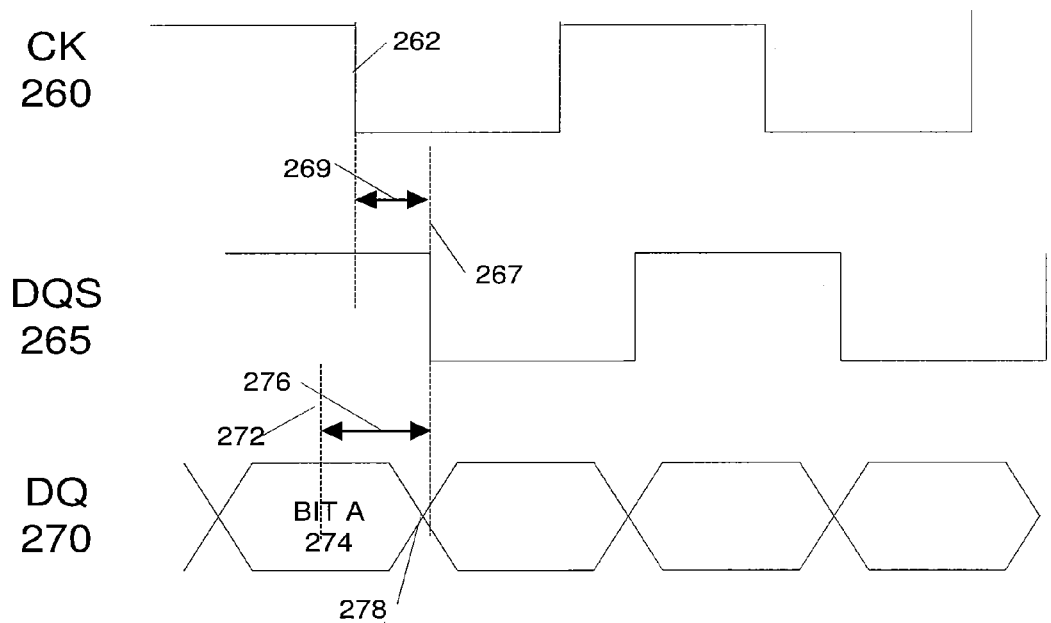

FIG. 2 is a timing diagram 200 illustrating various types of skew in a communication interface. The timing diagram 200 illustrates skew that may arise in a DRR-3 memory interface; however, embodiments of the present invention are applicable to skew in other types of standard or proprietary communications interface.

A first portion 205 of timing diagram 200 illustrates the signals output by a memory interface or other device including a communications bus interface. The first portion 205 includes a clock signal (CK) 210, at least one data signal (DQ) 220, and a data strobe signal (DQS) 215. Although only one DQ signal 220 is shown in timing diagram 200 for clarity, typical communication bus interfaces can include multiple DQ signals for each DQS signal.

As can be seen from timing diagram 200, the DQ signal 220 has a data rate equal to the frequency of the CK signal 210 and DQS signal 215. In this example, the memory interface or device outputs two bits of data, such as bit A 222 and bit B 224, on the DQ signal 220 on consecutive rising and falling edges of the DQS signal 215. The DQS signal 215 is produced by the memory interface for use by the receiving device, such as a memory device, in receiving and retiming the DQ signal 220. Specifically, a receiver samples the DQ signal 220 on the falling edge 230 and rising edge 232 of DQS signal 215. To ensure that the DQ signal 220 is sampled correctly, the DQS signal 215 is aligned so that edges 230 and 232 are in the center of each bit of DQ signal 220. For example, edge 230 is aligned with the center 235 of bit A 222 and edge 232 is aligned with the center 237 of bit B 224. This alignment ensures that each bit of the DQ signal 220 is sampled while the signal is stable.

A second portion 250 of timing diagram 200 illustrates the signals received by a memory unit, memory device, or other device receiving data via a communications bus interface. The second portion 250 includes a clock signal (CK) 260, at least one data signal (DQ) 270, and a data strobe signal (DQS) 265. Signals 260, 265, and 270 are versions of signals 210, 215, and 220 resulting from propagation delays between the source and receiver devices on the communications bus.

Since different signal paths can have different propagation delays, signals 260, 265, and 270 are skewed relative to each other. For example, although edges 225 and 230 of signals 210 and 215 are aligned at the signal source, the corresponding edges 262 and 267 are skewed relative to each other, resulting in a skew 269 between CK signal 260 and DQS signal 265. Similarly, a skew 276 exists between the falling edge 267 of DQS signal 265 and the center 272 of bit A 274 of DQ signal 270. Skew between the CK signal 260 and the DQS signal 265 can cause errors during the transfer of data from input circuits clocked by the DQS signal 265 to core circuits clocked by the CK signal 260 (or signals derived from the CK signal 260) in a memory device. Skew between the DQS signal 265 and the DQ signal 270 can cause errors during the reception of data at input circuit of the memory device.

To compensate for these skews, memory interfaces can include tapped delay lines to selectively delay one or more DQ and DQS signals. In this approach, one or more tapped delay lines are configured to output delayed versions of DQ, DQS, and any other signals. By delaying some signals relative to other signals at the signal source to compensate for the skew, the receiving memory device receives synchronized signals.

A specific embodiment of the present invention removes skew caused by the fly-by topology implemented in DDR3. That is, skew between DQS signals and clock signals, tDQSS, is reduced. Since the skew between DQ and DQS signals is not exacerbated by the fly-by topology, it is not addressed by these embodiments. In these embodiments, the DQ signals are adjusted the same amount as their corresponding DQS signal. Other embodiments of the present invention address and reduce the skew between DQ and DQS signals as well.

Figure 3:
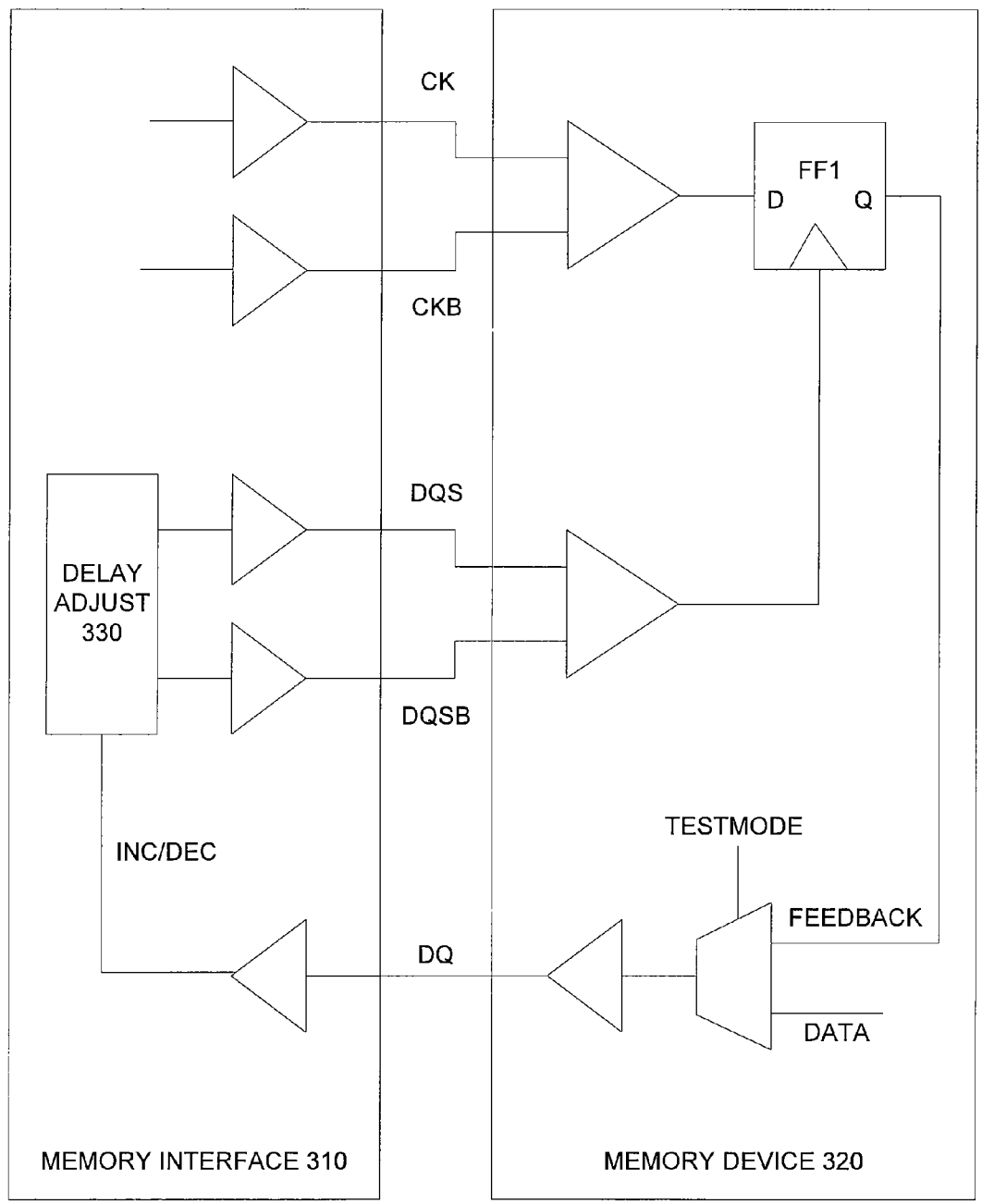
FIG. 3 illustrates a feedback loop system suitable for determining skew consistent with an embodiment of the invention.

FIG. 3 illustrates a feedback loop system suitable for determining skew consistent with an embodiment of the invention. This feedback loop system includes a memory interface 310 and a memory device 320. The memory device 320 can be placed in a calibration mode in which signals received by the memory device 320 from the memory interface 310 are used by the memory device 320 to generate a feedback signal. The feedback signal is output by the memory device 320 and received by the memory interface 310. To save pins, the feedback signal can be provided and received on pins that also serve as inputs or outputs when the calibration mode is deactivated.

Specifically, the clock signal CK and a DQS signal, as well as their complements CKB and DQSB, are provided by the memory interface circuit 310 to the memory device 320. The received DQS signal retimes the CK signal using flip-flop FF1. The delay adjust circuit 330 provides a delay to the DQS signal to compensate for the delay in the CK signal caused by a fly-by topology. In one embodiment of the present invention, the delay provided by the delay adjust circuit 330 is initially zero. Since the CK signal is delayed, an edge arrives at FF1 after a rising edge of the DQS signal, and is thus missed by FF1. DQS is then increasingly delayed by the delay adjust 330. At some point, the delay in the DQS signal provided by the delay adjust 330 is longer than the routing delay of CK caused by the fly-by, and the edge of the CK signal is caught by FF1. In this example, the output of FF1 is a feedback signal that is provided to the memory interface via a multiplexer that can provide a data output when the device is not in the calibration mode.

Memory interface 310 receives the feedback signal and uses it to adjust the delay provided by the delay adjust circuit 330. The feedback signal may be sampled using the system clock or other appropriate signal. The delay adjust 330 uses the feedback from the memory device 320 to select an phase delay for signals output by the memory interface 310, such that these signals are aligned with the CK signal when received by the memory device 320.

This calibration routine can be repeated once for each DQ/DQS group. In such an embodiment of the present invention, each DQ/DQS group uses one delay adjust circuit 330, though in practical circuits, some of the delay adjust circuit 330 can be shared among DQ/DQS groups. In other embodiments, one or more DQ signals in a DQ/DQS group may be calibrated independently of their corresponding DQS signal. In such an embodiment of the present invention, each DQ/DQS group typically uses two or more delay adjust circuits 330, though one may be used. Again, some of the circuitry involved may be shared, as is explained below.

In a typical embodiment of the present invention, the delay adjust circuit 330 can include a number of delay elements connected in series. The delay elements can be adjusted using a variable current that charges or discharges a capacitor. Each delay element may also be made up of a number of sub-elements connected in series, where outputs of the sub-elements are selected via multiplexers. Each multiplexer output then drives another delay element and also provides an output. In this way, the delay adjust circuit 330 includes a tapped delay line, where each multiplexer output is a tap. The outputs of the tapped delay line can be selected by another multiplexer that provides an output of the delay adjust circuit 330.

Thus, the delay adjust circuit 330 can be implemented using a tapped delay line and a multiplexer. In a specific embodiment of the present invention, one tapped delay line is used for some or all of the DQ/DQS groups. Two multiplexers are used for each DQ/DQS group, where one multiplexer selects a clock signal for a DQS signal and another selects a clock signal for one or more DQ signals. In another specific embodiment, two tapped delay lines are used for some or all of the DQ/DQS groups, and two multiplexers are used for each DQ/DQS group.

Figure 4A:
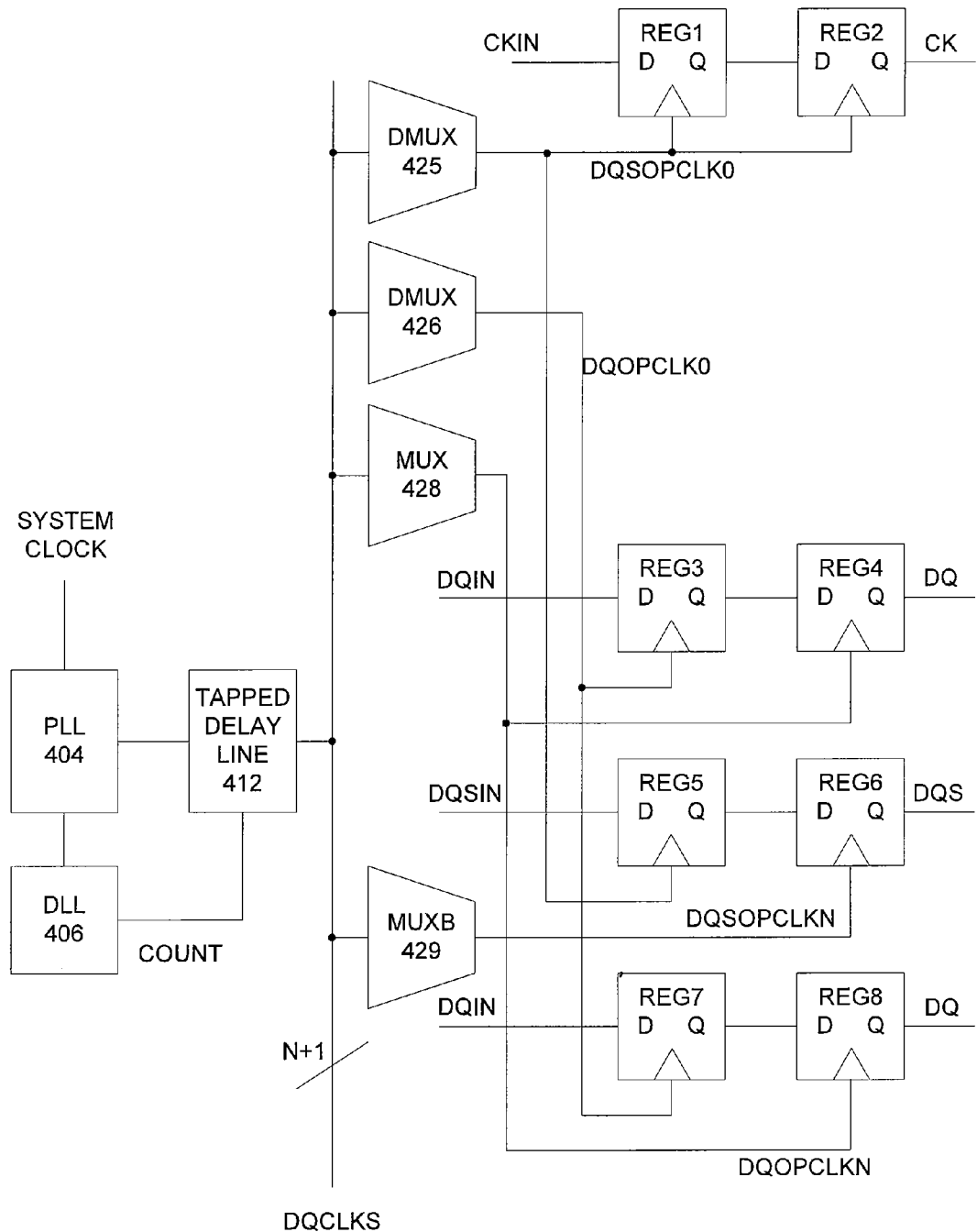
FIGS. 4A-4B are schematics of output circuits that can adjust for a timing skew, for example a timing skew caused by the routing of a clock signal in a fly-by topology.
Figure 4B:
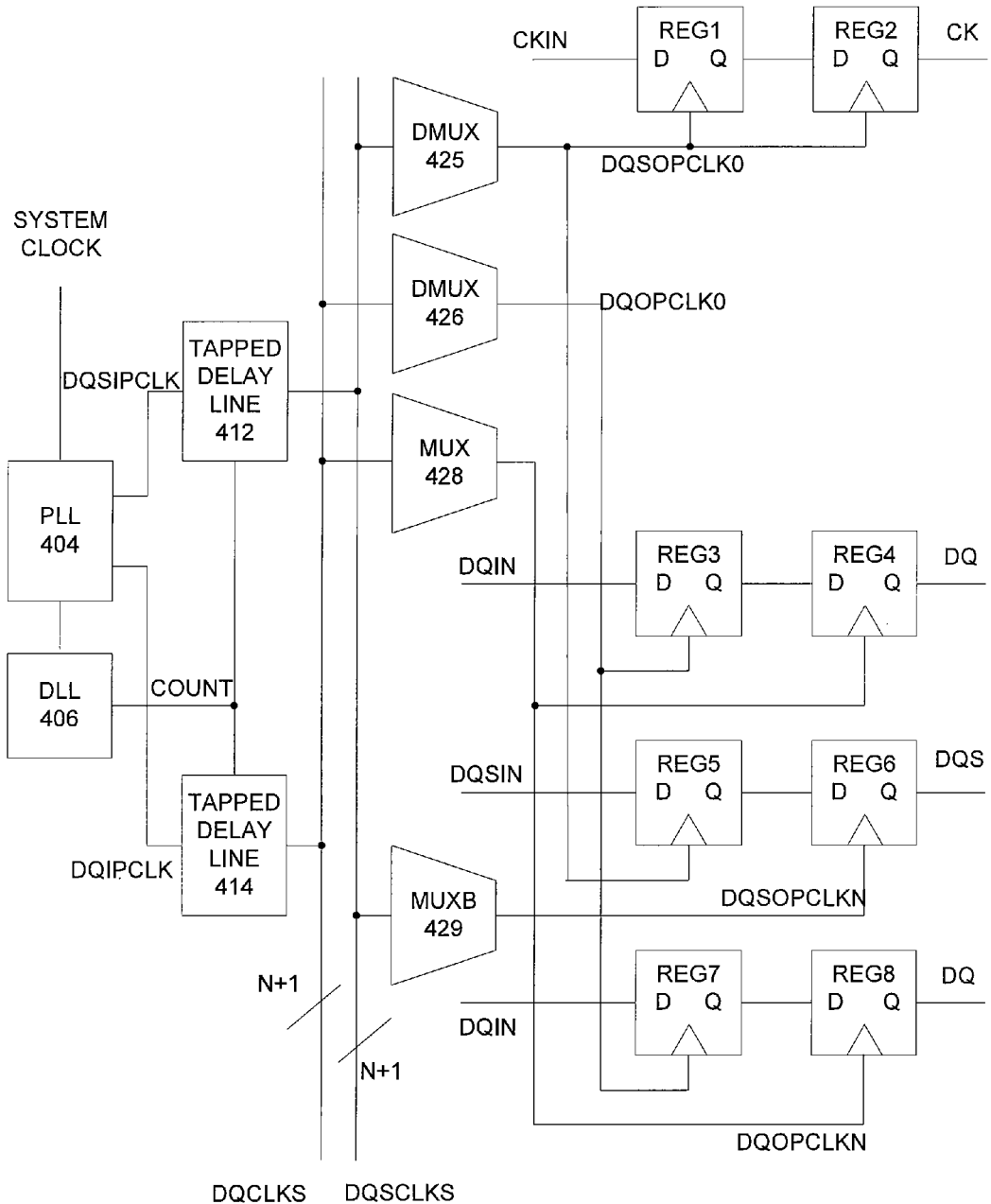

FIGS. 4A-4B are schematics of output circuits that can adjust for timing skew, for example, timing skew caused by the routing of a clock signal in a fly-by topology. FIG. 4A is a schematic of a circuit that can be used to compensate for skew between a clock signal and the signals in a DQ/DQS group. In these examples, the delay adjust circuit 300 is shown as a tapped delay line 412 and a separate multiplexer 429.

In this embodiment of the present invention, a number of phase-shifted clock signals are generated. The phase shifted clocks are generated using a tapped delay line 412, which again can be part of the delay adjust circuit 330 above. One of these phase shifted clock signals is selected using the method outlined above. The chosen clock signal DQSOPCLKN clocks a DQS output such that it is aligned with a CK signal when received at a memory or other receiving device. It should be noted that in various embodiments of the present invention, when the DQ and DQS signals are aligned, their edges are aligned, though typically, edges of the DQS signals are aligned to centers of the DQ data. Typically, the clock signals used to clock DQ and DQS signals are separated by 90 degrees, as described above. Accordingly, the selection of multiplexer 429, DQSOPCLKN, which clocks the DQS output signal, is determined during calibration. The selection of multiplexer 428, which clocks the DQ outputs, is typically determined by choosing the clock signal DQOPCLKN having a phase that is 90 degrees away (typically ahead) from DQSOPCLKN, though in other embodiments of the present invention, this clock may be calibrated as well.

The tapped delay line 412 receives a clock signal from a phase-locked loop (PLL) 404 and a count signal from a delay-locked loop (DLL) 406. The count signal adjusts the delays provided by the tapped delay line 412. A system clock signal is received from internal or external circuits or components, such as a crystal oscillator, by the PLL 404. In embodiments of the present invention, the system clock can be a master clock signal used to operate the logic circuits of a device that includes this circuitry. The DLL 406 includes a circuit to match the tapped delay line 412. In a specific embodiment of the present invention, this circuit is adjusted such that the total delay through it is one clock cycle, though other total delays may be used. The count signal used to adjust the DLL's delay line is provided to the tapped delay line 412 as shown. In an embodiment of the present invention, since the tapped delay line 412 is matched to a delay line in DLL 406, the delays provided by tapped delay line 412 are compensated for variations due to process, temperature, or voltage variations.

Again, in an embodiment of the present invention, the maximum delay of the tapped delay line 412 is equal to one system clock cycle, which is also the period of DQS signal. In this embodiment, if tapped delay line 412 has N equal delay stages, then the output of the tapped delay line will be N+1 phase-shifted versions of the input clock signal, where the additional output is the zero-phase shifted input signal. For example, given an input signal with a period T, the output of the tapped delay line from the first delay stage will be a version of the input signal shifted in phase by T/N. The output of the tapped delay line from the fourth delay stage will be a version of the input signal shifted in phase by 4T/N. In this manner, the tapped delay line 412 can output versions of the clock signal phase shifted by zero to N increments of its period, for a total of N+1 total outputs, referred to here as DQCLKS.

The N+1 outputs of the tapped delay line 412 are received by multiplexers 425, 426, 428 and 429. Multiplexer 425 provides a first clock DQSOPCLK0 to CK registers REG1 and REG2 and to input register REG5. Multiplexer 426 provides a second clock DQOPCLK0 to input registers REG3 and REG1. The multiplexers 425 and 426 do not need to be full multiplexers; they are included to match the delay imparted by multiplexers 428 and 429. In other embodiments of the present invention, these "dummy" multiplexers may be eliminated.

Multiplexer 428 selects one of the N+1 phase-shifted DQCLKS and provides an output clock DQOPCLKN to output registers REG4 and REG8. Multiplexer 429 selects one of the N+1 phase-shifted DQCLKS and provides an output to register REG6. In various embodiments of the present invention, one of more of these clock signals may be distributed using a symmetrical clock tree network.

The selection of one of the inputs to multiplexers 428 and 429 is selected by control signals that have been omitted for clarity. In an embodiment of the present invention, these control signals are generated by delay control logic as discussed above. Appropriate delay or phase shift settings are determined using a feedback calibration mode as described above, or by using other appropriate methods.

In this example, one tapped delay line 412 and two multiplexers 428 and 429 are shown. In various embodiments of the present invention, different numbers of delay lines and multiplexers may be used. Often, one tapped delay line is used for several or all DQ/DQS groups, while two multiplexers are used for each DQ/DQS groups, though other arrangements are possible.

FIG. 4B is another schematic of a circuit that can be used compensate for skew between a clock signal and DQS signals caused by clock signal routing in a fly-by topology. In this embodiment of the present invention, two sets of phase-shifted clock signals are generated. A first clock signal in the first set of phase shifted clock signals is selected using the method outlined above. The first clock signal clocks a DQS output such that it is aligned with a CK signal when received at a memory or other receiving device. A second clock signal in the second set of phase-shifted clock signals is selected and this phase-shifted second clock signal clocks one or more DQ outputs such that they are phase-shifted 90 degrees relative to their DQS signal.

Two sets of phase shifted clock signals, DQSCLKS and DQCLKS are generated, each set using one of the two tapped delay lines 412 and 414. The phase shift of each tapped delay line is adjusted by a count signal from a DLL 406, which adjusts based on a clock signal from a PLL 404. Again, a first clock DQSOPCLK0 is provided by a dummy multiplexer 425 to CK registers REG1 and REG2 and input register REG5. Dummy multiplexer 426 provides a second clock DQOPCLK0 to input registers REG3 and REG1. One of the N+1 DQCLKS is selected by multiplexer 428 and provided as DQOPCLKN. The DQOPCLKN signal clocks the DQ signals. One of the DQSCLKS is selected by multiplexer 429 and provided as DQSOPCLKN. This signal clocks the DQS output.

In embodiments of the present invention, the tapped delay lines can have any appropriate number of stages, and while in this example they have the same number of taps, in other embodiments they may have a different number of taps. For a signal having a period of T and a tapped delay line having N delay stages, the phase of a signal can be adjusted in increments of T/N. If an interface specified a maximum skew tolerance of $T_{Skew}$, this skew tolerance can be satisfied by ensuring that T/N is less than or equal to $T_{Skew}$. Furthermore, by increasing the number delay stages in the tapped delay line, the number of phase shifted versions of the signal is increased and hence the maximum skew between an output signal and any other signal is decreased.

In this example, two tapped delay lines 412 and 414 and two multiplexers 428 and 429 are shown. In various embodiments of the present invention, different numbers of delay lines and multiplexers may be used. Often, one tapped delay line is used for several or all DQ/DQS groups, while two multiplexers are used for each DQ/DQS groups, though other arrangements are possible.

The registers shown in this example may be double data-rate registers, such as those shown in the following figures. Alternately, other types of registers may be used.

Figure 5A:
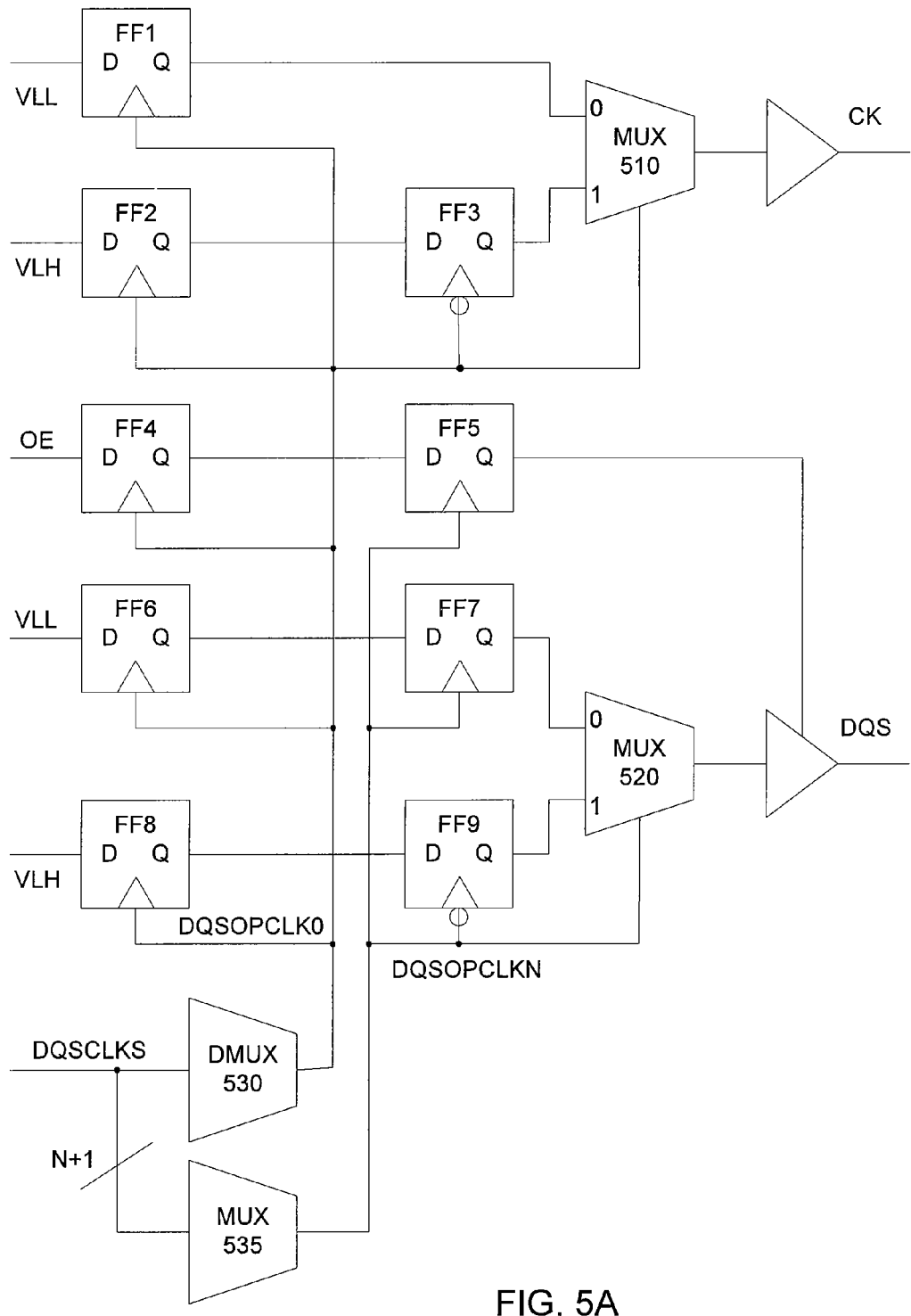
FIGS. 5A-5C are schematics of output circuits according to embodiments of the present invention.
Figure 5B:
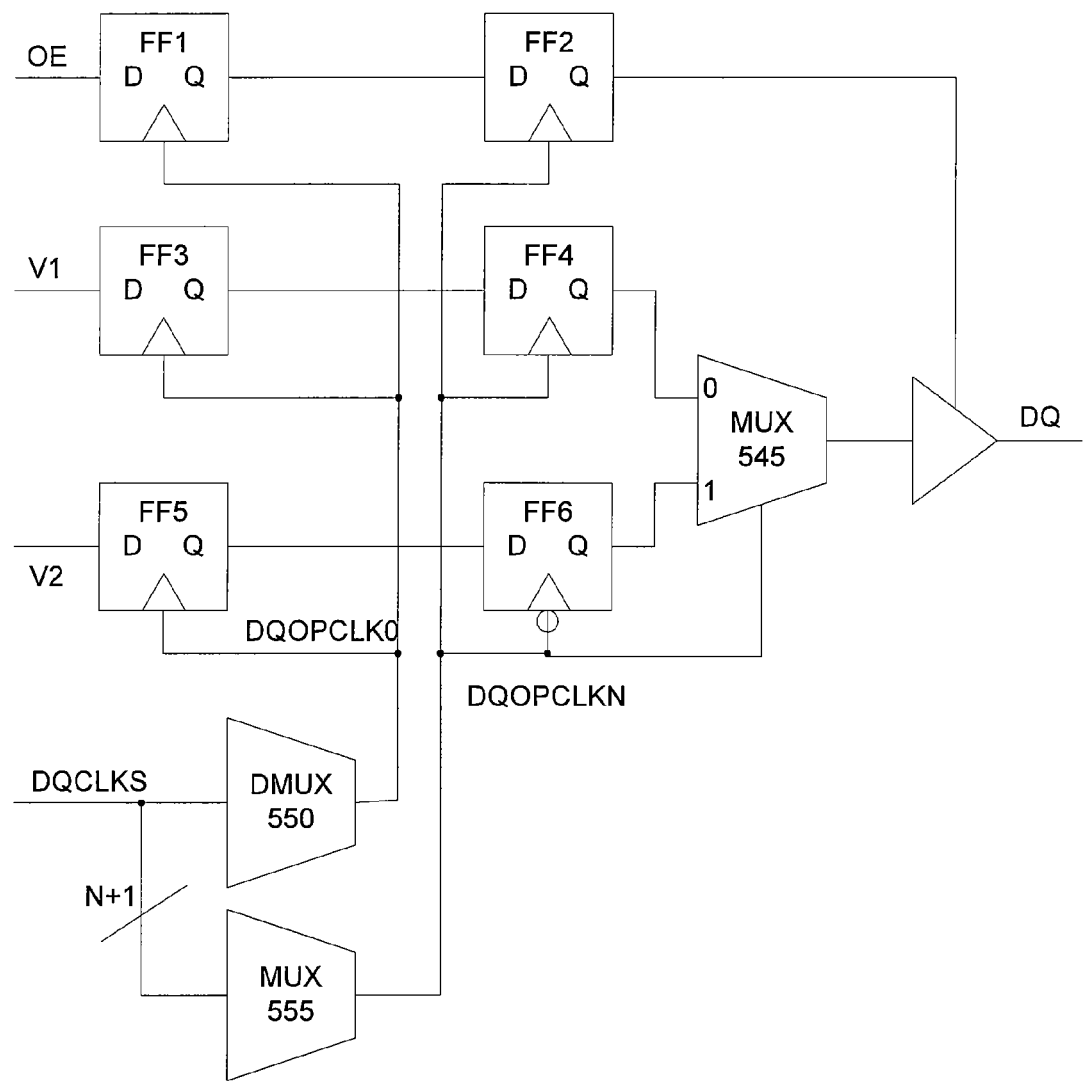
Figure 5C:
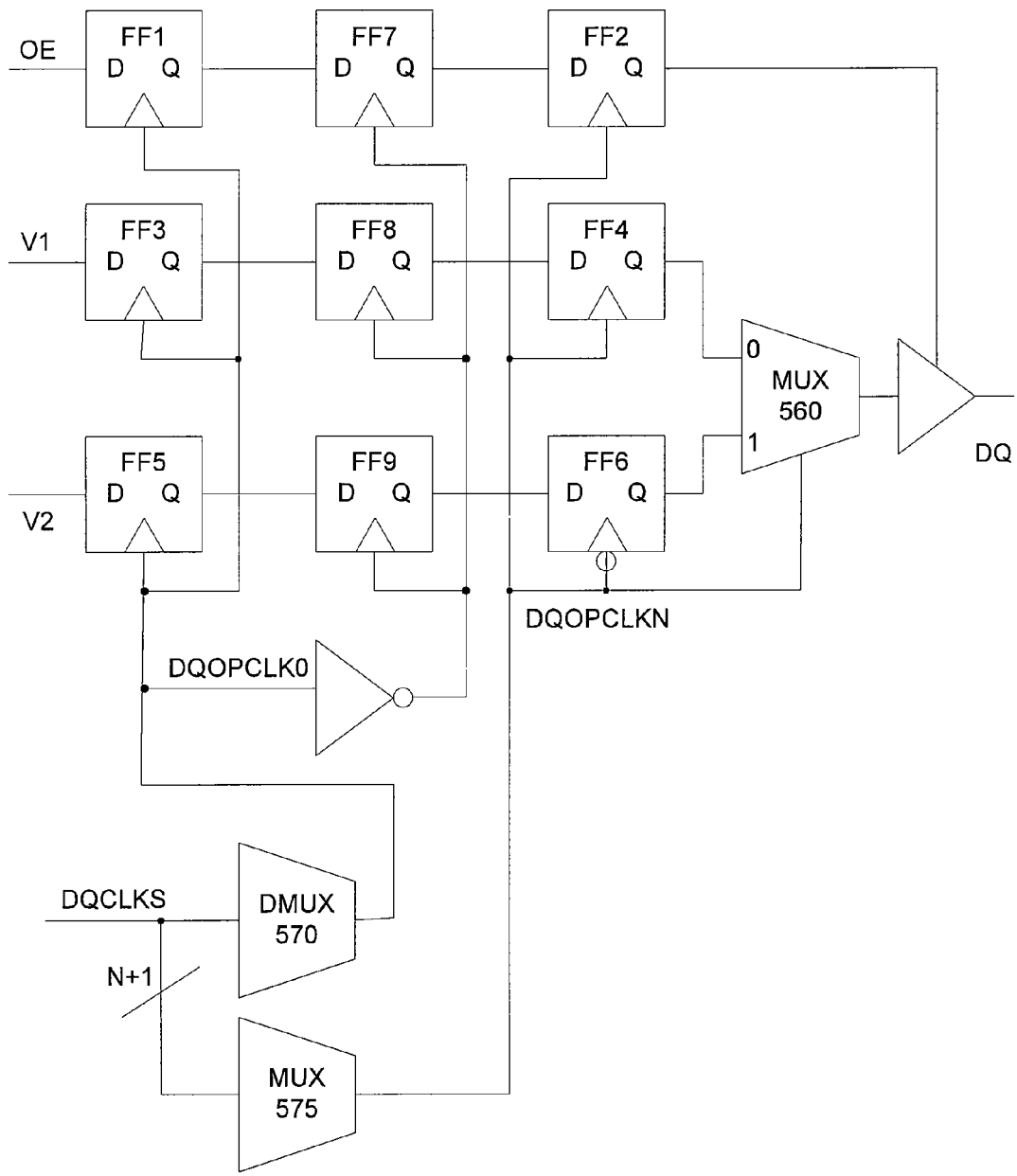

FIGS. 5A-5C are schematics of output circuits according to embodiments of the present invention. FIG. 5A is a schematic of output circuits for generating clock and DQS signals. Instances of these circuits are suitable for use as REG1, REG2, REG5, and REG6 in FIGS. 4A and 4B. In this example, the DQS signal is gated, so its output driver has an enable input, while the CK signal is continuous, so its output driver does not have an enable input.

The output signal DQS is gated by an enable signal OE, which is received by flip-flop FF4 and retimed to the output clock DQSOPCLKN by FF5. DQS itself is an alternating signal generated by a logic low signal VLL and a logic high signal VLH. Specifically, VLL is received by FF6 and passed to FF7, while VLH is received by FF8 and passed to FF9. The outputs of FF7 and FF9 are chosen in an alternating fashion by multiplexer 520, whose select signal is the output clock DQSOPCLKN. The output of multiplexer 520 is provided as DQS when the output buffer is enabled by the OE flip-flops FF4 and FF5.

The clock signal is similarly generated using FF1, FF2, FF3, and multiplexer 510. Again, since the clock signal CK is continuous, its output buffer is not gated.

A number of phase-shifted clocks DQCLKS are received by multiplexers 530 and 535. Again, multiplexer 530 is a dummy multiplexer inserted in the clock path to match the delay through multiplexer 535. Multiplexer 535 selects one of the N+1 DQCLKS or DQSCLKS, depending on whether the implementation of FIG. 4A or FIG. 4B is used, according to the method outlined above, or other appropriate method. The chosen clock, DQSOPCLKN, clocks output flip-flops FF5, FF7, and FF9, such that the DQS signal arrives aligned with the CK signal at a receiving device.

FIG. 5B is a schematic of an output circuit for generating DQ signals. As with the DQS output, the DQ output is gated, so its output buffer receives an enable signal from output enable flip-flops FF1 and FF2.

A number of phase-shifted clock signal DQCLKS are received by multiplexers 550 and 555. As before, multiplexer 550 is a dummy multiplexer inserted in the clock to match multiplexer 555. Multiplexer 550 provides the clock signal to input flip-flops FF1, FF3, and FF5. Multiplexer 555 selects one of the DQCLKS as before and provides it as DQOP-CLKN to the output flip-flops FF2, FF4, and FF6.

Flip-flops FF3 and FF5 receive data signals V1 and V2 respectively, for example, from a core circuit, or often from a parallel-to-serial converter. The outputs of flip-flops FF3 and FF5 are provided to flip-flops FF4 and FF6. The outputs of FF4 and FF6 are multiplexed by multiplexer 545 to generate the DQ output. FF6 is clocked by falling edges of DQOP-CLKN while FF4 is clocked by rising edges of DQOPCLKN. The output of FF4 changes on rising edges of OPCLKN and is selected by multiplexer 545 once DQOPCLKN returns low. Similarly, the output of FF6 changes on falling edges of DQOPCLKN and is selected by multiplexer 545 once DQOP-CLKN returns high.

In the above two examples, two levels of flip-flops are used to transfer signals from the unshifted clock domain to the phase shifted clock domain. For example, flip-flops FF4 and FF5 transfer the output enable signal from the unshifted clock domain to the phase shifted clock domain.

One problem with this approach is that the phase difference between these two clock domains must be longer than the set up and hold time required by the flip-flops. For example, the phase difference between clock signal DQOPCLK0 and phase shifted clock signal DQOPCLKN must be longer than the set up and hold time required by the input of flip-flop FF4. If this is not the case, then the output of flip-flop FF3 may change too soon for FF4 to latch, resulting in an error. A solution that may be used by embodiments of the present invention is shown in the following figure.

FIG. 5C is a schematic of an output circuit for generating DQ signals that addresses this problem. This output circuit is similar to that of the previous figure, with additional registers to help in transferring from the unshifted phase domain to the shifted phase domain. This circuit includes flip-flops FF7 to transfer an output enable signal and FF8 and FF9 to transfer data signals from the unshifted clock domain to the phase shifted clock domain.

Flip-flop FF7 is connected between registers FF1 and FF2. FF1 is clocked by a clock signal DQOPCLK0. FF2 is clocked by a phase shifted version of the clock signal selected by multiplexer 570. Flip-flop FF7 is clocked by an inverted version of the clock signal DQOPCLK0 that is produced by an inverter. Thus, FF7 operates 180 degrees out of phase with FF1. Because of this, FF7 has sufficient time to latch the output of FF1. Similarly, FF2 has sufficient time to latch the output of FF7. The above is also true for flip-flops FF3, FF8, and FF4, as well as FF5, FF9, and FF6.

Figure 6A:
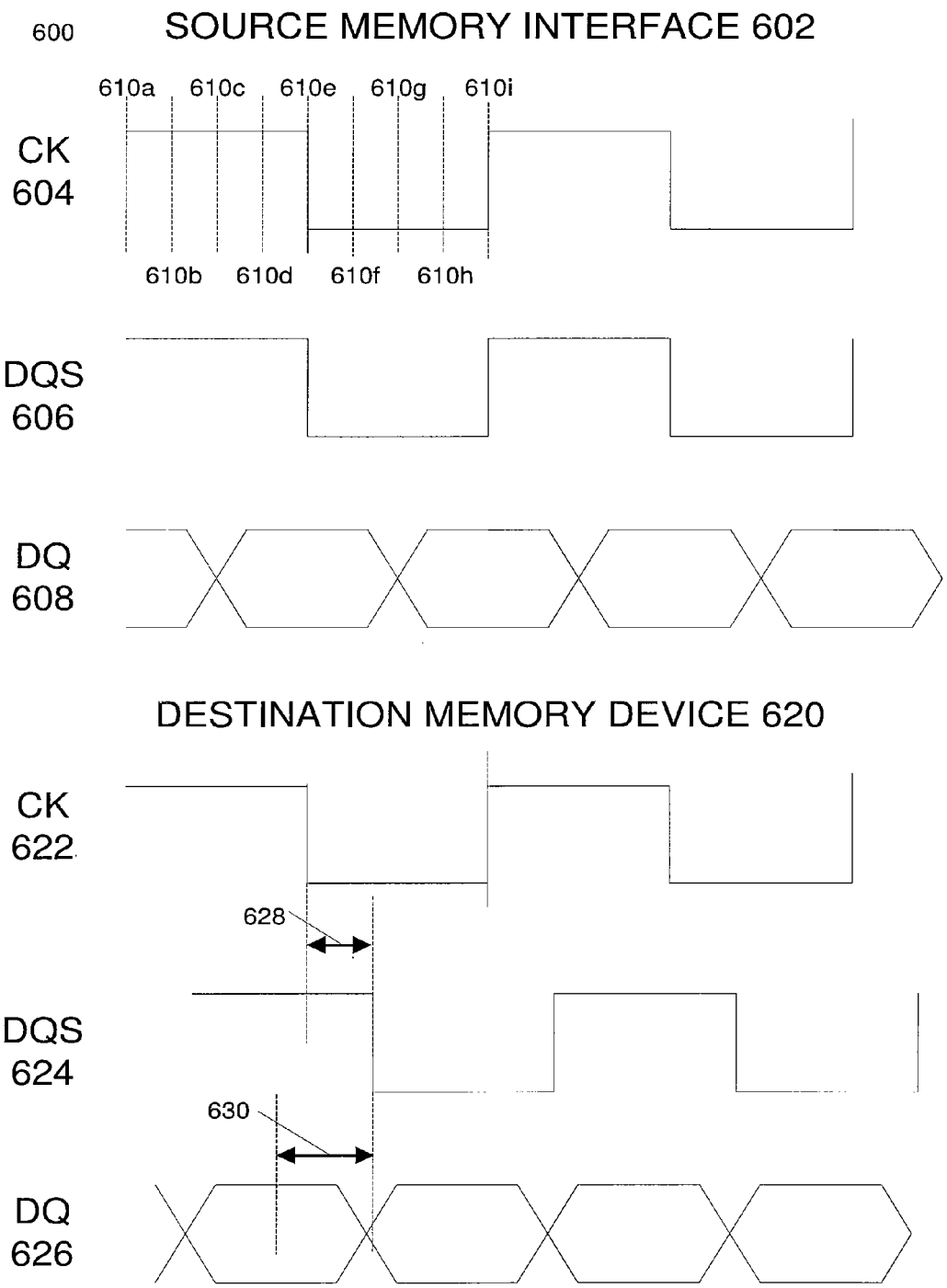
FIGS. 6A-6B are timing diagrams illustrating the operation of skew compensating circuits according to an embodiment of the invention.
Figure 6B:
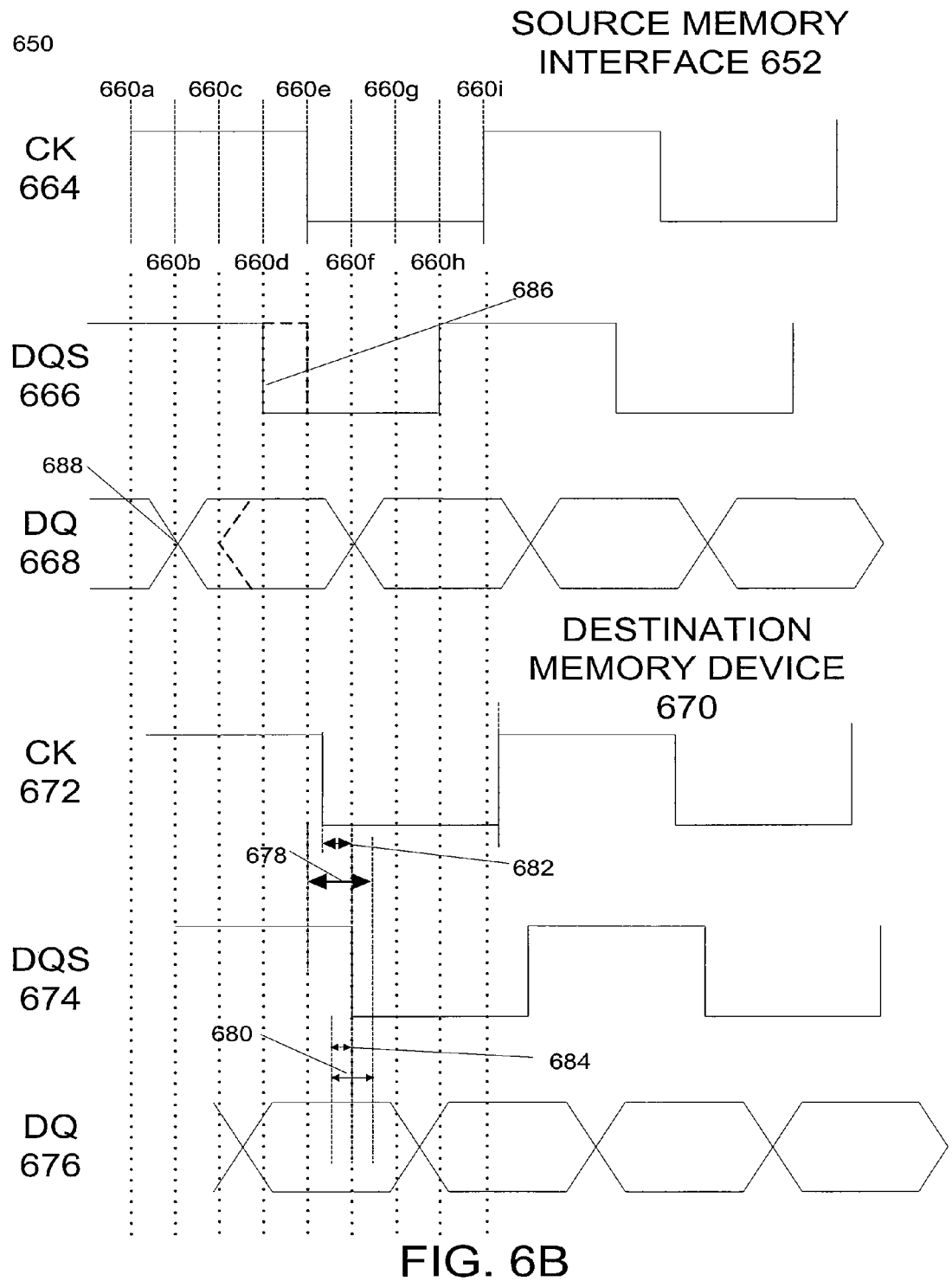

FIGS. 6A-6B are timing diagrams illustrating the operation of skew compensating circuits according to an embodiment of the invention. FIG. 6A is a timing diagram 600 illustrating the problem of skew prior to the application of embodiments of the invention.

A first portion 602 of timing diagram 600 illustrates the signals output by a memory interface or other device including a communications bus. The first portion 602 includes a clock signal (CK) 604, at least one data signal (DQ) 608, and a data strobe signal (DQS) 606. Although only one data signal (DQ) 608 is shown in timing diagram 600 for clarity, typical communication bus interfaces can include multiple data signals (DQ) for each data strobe signal (DQS).

As can be seen from timing diagram 600, the DQ signal 608 has a data rate that is the same frequency as the CK signal 604 and DQS signal 606. Embodiments of the present invention can shift the DQS signal 606 and the DQ signal 608 to align with the clock signal CK to compensate for skew at the receiving device.

A second portion 620 of timing diagram 600 illustrates the signals received by a memory unit, memory device, or other device receiving data via the communications bus interface. The second portion 620 includes a clock signal (CK) 622, at least one data signal (DQ) 624, and a data strobe signal (DQS) 626. Signals 622, 624, and 626 are versions of signals 604, 606, and 608 resulting from propagation delays between the source and receiver devices on the communications bus.

Because different signal paths can have different propagation delays, signals 622, 624, and 626 are skewed relative to each other. Skew 628 represents the misalignment between CK signal 622 and DQS signal 624 at the memory unit or other device. This skew may be caused by the use of a fly-by topology. Similarly, skew 630 represents the misalignment between the DQS signal 624 and the DQ signal 626.

FIG. 6B is a timing diagram 650 illustrating the application of embodiments of the invention. A first portion 652 of timing diagram 650 illustrates the signals output by a memory interface. The first portion 652 includes a clock signal (CK) 654, at least one data signal (DQ) 658, and a data strobe signal (DQS) 656. Although only one data signal (DQ) 658 is shown in timing diagram 650 for clarity, typical communication bus interfaces can include multiple data signals (DQ) for each data strobe signal (DQS).

A second portion 670 of timing diagram 650 illustrates signals received by a memory unit, memory device, or other device. The second portion 670 includes a clock signal (CK) 672, at least one data signal (DQ) 674, and a data strobe signal (DQS) 676. Signals CK 672, DQS 674, and DQ 676 are versions of signals CK 664, DQS 666, and DQ 668 resulting from propagation delays between the source and receiver devices.

Embodiments of the invention can phase shift signals DQS 666 and DQ 668 at the source memory interface so that they are aligned with CK 672 to reduce skew at the signal destination. Because the CK signal is delayed a different amount for each memory device, each DQ/DQS group may be aligned independently. Again each DQ/DQS group may be aligned as one, or the DQS in a group may be aligned independently from one or more of its DQ signals.

In this example, the DQS signal is phase shifted so that edge 686 is aligned with phase 660d, rather than phase 660e as shown in FIG. 6A. Similarly, signal DQ 668 is phase shifted so that the transition point 686 is aligned with phase 660b, rather than phase 660c as shown in FIG. 6A.

At the signal destination, the skew 682 represents the misalignment between CK signal 672 and DQS signal 674 at the memory unit or other device receiving data via the communications bus. Similarly, skew 684 represents the misalignment between DQS signal 674 and DQ signal 676 at the memory unit or other device receiving data via the communications bus. Skews 682 and 684 are substantially less than the skews 678 and 680, which would result if no phase shifts were applied to the signal at the source memory interface.

Figure 7:
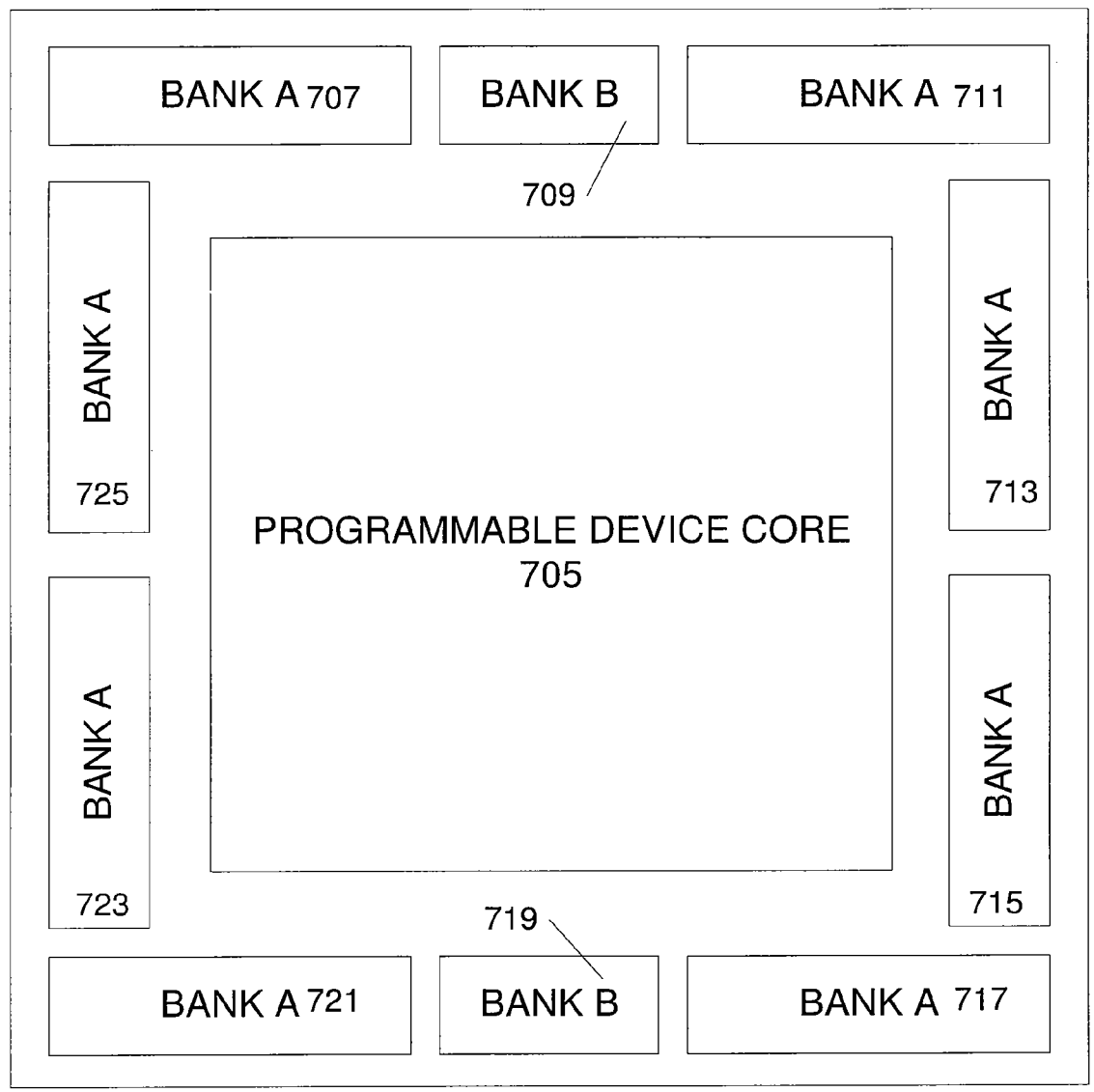
FIG. 7 illustrates an exemplary programmable device suitable for use with embodiments of the invention.

FIG. 7 illustrates an exemplary programmable device architecture 700 suitable for use with embodiments of the invention. Device architecture 700 includes a programmable device core 705. Programmable device core 705 includes programmable device components such as logic cells, functional blocks, memory units, and a configurable switching circuit.

Device architecture 700 includes a plurality of I/O banks, such as I/O banks 707, 709, 711, 713, 715, 717, 719, 721, 723, and 725. In an embodiment, device architecture 700 allows for any number of I/O banks.

In an embodiment, the plurality of I/O banks belong to a limited number of I/O bank types. For example, I/O banks 707, 711, 713, 715, 717, 721, 723, and 725 are of I/O bank type A. I/O banks 709 and 719 belong to I/O bank type B. Each I/O bank type specifies the number of I/O pins and other attributes for its member I/O banks. For example, type A I/O banks may have 60 I/O pins and type B I/O banks may have 36 I/O pins. The number of I/O banks types is not limited to two types, and many common implementations of device architecture 700 may include four or more different I/O types.

Embodiments of the invention include circuits such as circuits 400, 450, 500, and 550 in some or all of the I/O banks 707, 709, 711, 713, 715, 717, 719, 721, 723, and 725 of device architecture 700.

Figure 8:
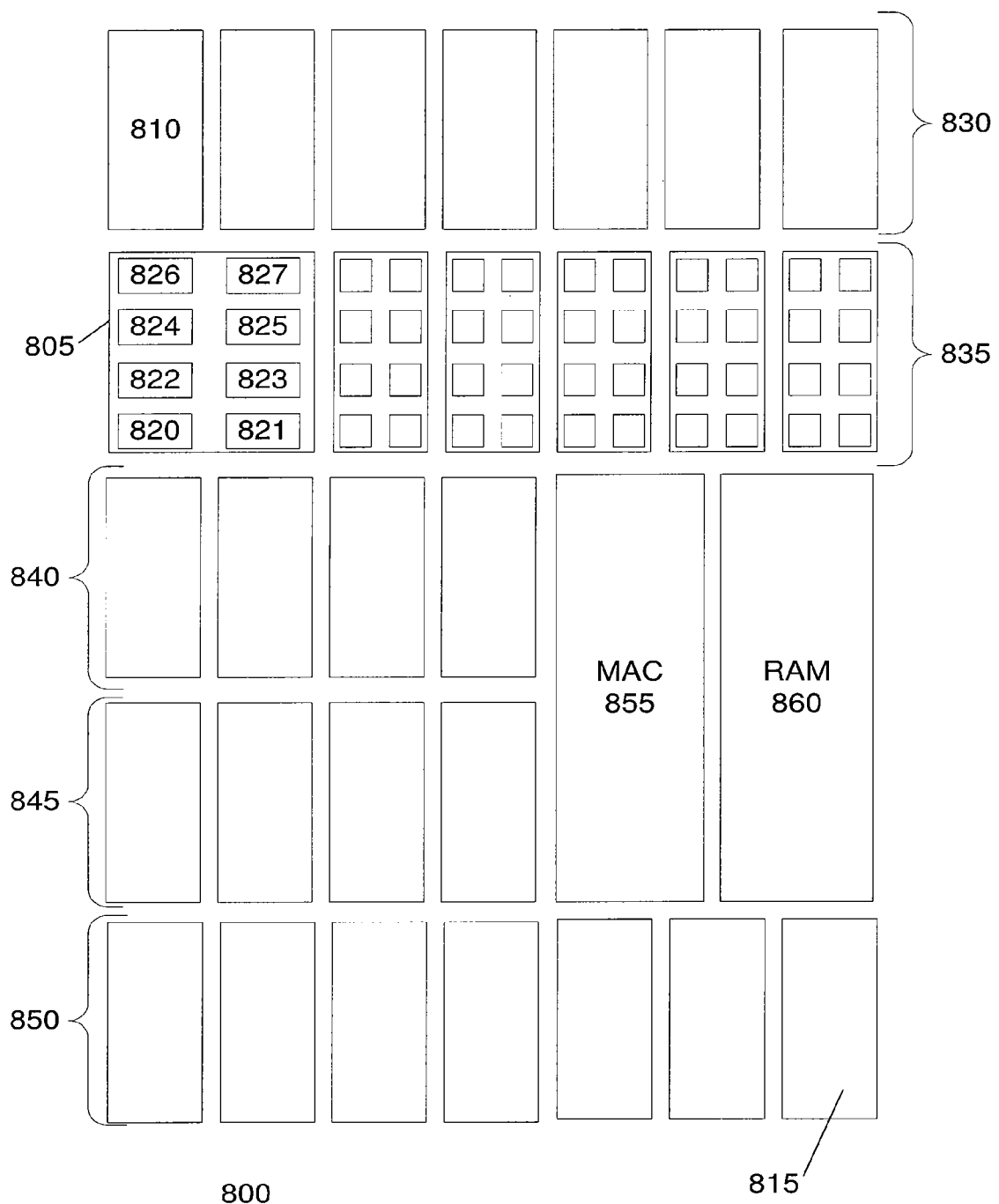
FIG. 8 illustrates an exemplary programmable device core suitable for implementing control logic for use with embodiments of the invention.

FIG. 8 illustrates an exemplary programmable device core 800 suitable for implementing control logic suitable for use with embodiments of the invention. Control logic can include logic for higher-level functionality of the memory interface, such as memory access protocols and calibration modes, which determine appropriate settings for multiplexers in circuits 400, 450, 500, and 550 to reduce or eliminate skew.

FIG. 8 illustrates a programmable device 800 suitable for use with an embodiment of the invention. Programmable device 800 includes a number of logic array blocks (LABs), such as LABs 805, 810, and 815. Each LAB includes a number of programmable logic cells using logic gates and/or look-up tables to perform logic operations, as well as registers to store and retrieve data. LAB 805 illustrates in detail logic cells 820, 821, 822, 823, 824, 825, 826, and 827. Logic cells are omitted from other LABs in FIG. 8 for clarity. The LABs of device 800 are arranged into rows 830, 835, 840, 845, and 850. In an embodiment, the arrangement of logic cells within a LAB and of LABs within rows provides a hierarchical system of configurable connections of a programmable switching circuit, in which connections between logic cells within a LAB, between cells in different LABs in the same row, and between cells in LABs in different rows require progressively more resources and operate less efficiently.

In addition to logic cells arranged in LABs, programmable device 800 also include specialized functional blocks, such as multiply and accumulate block (MAC) 855 and random access memory block (RAM) 860. The configuration of the programmable device is specified at least in part by configuration data stored in configuration memory 875. The configuration data can include values for lookup tables defining the functions of logic cells; values of control signals for multiplexers and other switching devices used by the configurable switching circuit to route signals between inputs, outputs, logic cells, and functional blocks; and values specifying other aspects of the configuration of the programmable device, such as modes of operation of the programmable device and its assorted functional blocks and logic cells. Although the configuration memory 875 is shown in FIG. 8 as a monolithic unit, in some programmable devices, configuration memory 875 is scattered all over the programmable device. In these types of programmable devices, portions of the configuration memory can lie within the logic cells, functional blocks, and configurable switching circuit of the programmable device.

For clarity, the portion of the programmable device 800 shown in FIG. 8 only includes a small number of logic cells, LABs, and functional blocks. Typical programmable devices will include thousands or tens of thousands of these elements.

Further embodiments can be envisioned by one of ordinary skill in the art after reading the attached documents. For example, although the invention has been discussed with reference to programmable devices, it is equally applicable to standard or structured ASICs, gate arrays, and general digital logic devices. In other embodiments, combinations or subcombinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A memory interface comprising:
   a first delay circuit to receive a first clock signal and to output a plurality of phase-shifted versions of the first clock signal;
   a first selection circuit for selecting a first one of the plurality of phase-shifted versions of the first clock signal, wherein a first signal is clocked with the selected first one of the plurality of phase-shifted versions of the first clock signal;
   a second selection circuit for selecting a second one of the plurality of phase-shifted versions of the first clock signal based on a delay between the first signal and a second signal, wherein the second signal is clocked with the selected second one of the plurality of phase-shifted versions of the first clock signal; and
   receiver circuitry coupled to receive the first signal and the second signal.

2. The memory interface of claim 1, wherein the first selection circuit is a first multiplexer and wherein the second selection circuit is a second multiplexer.

3. The memory interface of claim 1, wherein the first delay circuit provides a maximum delay approximately equal to a period of the first clock signal.

4. The memory interface of claim 2, wherein the first multiplexer is responsive to a first multiplexer control signal and the second multiplexer is responsive to a second multiplexer control signal.

5. The memory interface of claim 4, wherein the first and second multiplexer control signals are determined from a calibration mode used to measure skew.

6. The memory interface of claim 1, further comprising a first flip-flop clocked by the first clock signal and a second flip-flop clocked by the selected first one of the plurality of phase-shifted versions of the first clock signal.

7. The memory interface of claim 1, wherein the first signal is a DQ signal and wherein the second signal is a DQS signal.

8. The memory interface of claim 1, wherein the receiver circuitry is further coupled to sample the first signal on a rising or a falling edge of the second signal.

9. A memory interface comprising:
   a first delay line to receive a first clock signal and to output a plurality of phase-shifted versions of the first clock signal;
   a first selection circuit operative to select a first one of the plurality of phase-shifted versions of the first clock signal, wherein first signals are clocked with one of the first plurality of phase-shifted versions of the first clock signal; and a second selection circuit operative to select a second one of the plurality of phase-shifted versions of the first clock signal based on a delay between the first signals and second signals, wherein the second signals are clocked with the second one of the plurality of phase-shifted versions of the first clock signal.

10. The memory interface of claim 9, wherein the first selection circuit is a first multiplexer and wherein the second selection circuit is a second multiplexer.

11. The memory interface of claim 9, wherein the first one of the plurality of phase-shifted versions of the first clock signal is the same as the second one of the plurality of phase-shifted versions of the first clock signal.

12. The memory interface of claim 9, wherein the first one of the plurality of phase-shifted versions of the first clock signal is different from the second one of the plurality of phase-shifted versions of the first clock signal.

13. The memory interface of claim 9, wherein the first signals includes at least one DQ signal and the second signals includes at least one DQS signal.

14. The memory interface of claim 9, wherein the first delay line provides a maximum delay approximately equal to a period of the first clock signal.

15. The memory interface of claim 9, further comprising receiver circuitry coupled to receive the first signals and the second signals and to sample each of the first signals on a rising or a falling edge of a respective one of the second signals.

16. A method of providing signals using a memory interface, the method comprising:

receiving a first clock signal;

generating a plurality of second clock signals by successively delaying the first clock signal;

selecting, with a first selection circuit, a first one of the plurality of second clock signals, wherein a first signal is clocked with the selected first one of the second plurality of clock signals;

selecting, with a second selection circuit, a second one of the plurality of second clock signals, wherein a second signal is clocked with the selected second one of the second plurality of clock signals; and sampling the first signal on a rising or a falling edge of the second signal.

17. The method of claim 16 wherein the second one of the second plurality of clock signals is the same as the first clock signal.

18. The method of claim 16 wherein the second one of the second plurality of clock signals is selected based on a delay between the first signal and the second signal.

19. The method of claim 16 further comprising:

selecting a third one of the plurality of second clock signals, wherein a third signal is clocked with the selected third one of the second plurality of clock signals.

20. The method of claim 16 wherein the first signal is a DQ signal and the second signal is a DQS signal.

* * * * *